US012027445B2

(12) United States Patent
Choi (10) Patent No.: US 12,027,445 B2
(45) Date of Patent: Jul. 2, 2024

(54) SYSTEM FOR COOLING SEMICONDUCTOR COMPONENT, METHOD OF MANUFACTURING THE SAME, AND SEMICONDUCTOR PACKAGE HAVING THE SYSTEM (71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 415 days.

(21) Appl. No.: 17/519,520

(22) Filed: Nov. 4, 2021

(65) Prior Publication Data

US 2022/0246494 A1 Aug. 4, 2022

(30) Foreign Application Priority Data

Feb. 2, 2021 (KR) .......................... 10-2021-0014594

(51) Int. Cl.
*H01L 23/473* (2006.01)
*H01L 23/31* (2006.01)
(52) U.S. Cl.
CPC ............ *H01L 23/473* (2013.01); *H01L 23/31* (2013.01)
(58) Field of Classification Search
CPC ... H01L 23/473; H01L 23/31; H01L 23/3677; H01L 23/3735; H01L 23/4334
USPC ........................................................ 257/714
See application file for complete search history.

(56) References Cited

U.S. PATENT DOCUMENTS

| 8,492,164 | B2 * | 7/2013 | Fitzgerald | ............... F15D 1/001 156/99 |
| 11,398,447 | B2 * | 7/2022 | Ogawa | .................. H01L 23/053 |
| 2011/0316143 | A1 * | 12/2011 | Noritake | ............... H01L 23/473 257/713 |
| 2012/0012295 | A1 * | 1/2012 | Kakiuchi | ................ F28F 13/06 165/185 |

FOREIGN PATENT DOCUMENTS

| EP | 3825118 A1 * | 5/2021 | ............ B32B 15/01 |
| JP | H6-315731 A | 11/1994 | |
| JP | H11-54675 A | 2/1999 | |
| JP | 2009-206191 A | 9/2009 | |

(Continued)

*Primary Examiner* — Caleen O Sullivan
(74) *Attorney, Agent, or Firm* — Park, Kim & Suh, LLC (57) ABSTRACT

Provided is a system for cooling semiconductor components including: a cover body including at least one upper cover and lower cover, which are separated from each other, face each other, and are combined to form a coolant flow path in an inner space thereof; an inlet combined to one side of the cover body and used for a coolant to flow in; an outlet combined to the other side of the cover body and used for the coolant to be discharged; at least one connecting part pin inserted and arranged toward a flowing direction of the coolant in the inner space of the cover body; and insertion grooves formed for the connecting part pins to be inserted in the inner space of the cover body, wherein the upper cover or the lower cover of the cover body is combined to at least one of the upper surfaces or the lower surfaces of semiconductor components by using connecting members so that heat transmitted from the semiconductor components to the connecting part pins is efficiently radiated by enlarging an area contacting the coolant.

17 Claims, 11 Drawing Sheets

(56) References Cited

FOREIGN PATENT DOCUMENTS

| | | |
|---|---:|---|
| JP | 4835807 B2 | 12/2011 |
| JP | 2013-62506 A | 4/2013 |
| JP | 5572678 B2 | 8/2014 |
| JP | 2017-27976 A | 2/2017 |
| JP | 2017-135181 A | 8/2017 |
| JP | 2019-204922 A | 11/2019 |
| KR | 10-1472642 B1 | 12/2014 |
| KR | 10-2019-0133156 A | 12/2019 |
| KR | 10-2020-0133883 A | 12/2020 |
| WO | 2019/163600 A1 | 8/2019 |

\* cited by examiner

SYSTEM FOR COOLING SEMICONDUCTOR COMPONENT, METHOD OF MANUFACTURING THE SAME, AND SEMICONDUCTOR PACKAGE HAVING THE SYSTEM

CROSS-REFERENCE TO RELATED PATENT APPLICATION

This application claims the benefit of Korean Patent Application No. 10-2021-0014594, filed on Feb. 2, 2021, in the Korean Intellectual Property Office, the disclosure of which is incorporated herein in its entirety by reference.

BACKGROUND OF THE INVENTION

1. Field of the Invention

The present invention relates to a system for cooling semiconductor components, a method of manufacturing the same, and a semiconductor package having the system, wherein the system includes connecting part pins separately manufactured to be arranged in a cover body so that the connecting part pins having various forms such as a linear or non-linear structure may be formed to enlarge an area contacting a coolant and thereby, to improve heat radiation effect and heat conductivity effect.

2. Description of the Related Art

As well known in the art, electrical and electronic components, in particular, semiconductor components, generate heat while being operated and thus, a heat sink or a cooling system is needed to prevent overheating so as to maintain their performance.

Particularly, semiconductor components applied to a high-power application field prevent overheating by using a cooling system which circulates a coolant.

The cooling system includes a connecting part pin inserted thereto for contacting a circulating coolant and cools heat transmitted from the semiconductor components to the connecting part pin. In general, the connecting part pin is formed as in one body with an upper substrate or a lower substrate included in the cooling system by using a manufacturing or a casting production process and thus, mostly has a linear structure.

However, the connecting part pin having a linear structure has limitations in maximizing heat conductivity effect or heat radiation effect. Accordingly, the connecting part pin having various forms such as a linear or non-linear structure is needed to improve heat conductivity effect or heat radiation effect.

SUMMARY OF THE INVENTION

The present invention provides a system for cooling semiconductor components, a method of manufacturing the same, and a semiconductor package having the system, wherein the system includes connecting part pins separately manufactured to be arranged in a cover body so that the connecting part pins having various forms such as a linear or non-linear structure may be formed to enlarge an area contacting a coolant and thereby, to improve heat radiation effect and heat conductivity effect.

According to an aspect of the present invention, there is provided a system for cooling semiconductor components including: a cover body comprising at least one upper cover and lower cover, which are separated from each other, face each other, and are combined to form a coolant flow path in an inner space thereof; an inlet combined to one side of the cover body and used for a coolant to flow in; an outlet combined to the other side of the cover body and used for the coolant to be discharged; at least one connecting part pin inserted and arranged toward a flowing direction of the coolant in the inner space of the cover body; and insertion grooves formed for the connecting part pins to be inserted in the inner space of the cover body, wherein the upper cover or the lower cover of the cover body is combined to at least one of the upper surfaces or the lower surfaces of semiconductor components by using connecting members and thus, heat transmitted from the semiconductor components to the connecting part pins is cooled by the coolant.

The insertion grooves may be formed for each connecting part pin to be simultaneously inserted in the inner surfaces of the upper cover and the lower cover, which face each other, or the insertion grooves may be formed for the connecting part pins to be inserted in the inner surfaces of the upper cover or the lower cover, which face each other.

The temperature of the coolant may be the same as or lower than the surface temperature of the upper surfaces or the lower surfaces of the semiconductor components joined to the upper cover or the lower cover of the cover body.

The connecting part pins may be inserted into the insertion grooves by placing a gap interposed therebetween.

The size of the gap may be 5 mm or below.

The upper sides or the lower sides of the connecting part pins may partially contact the sides of the insertion grooves.

The coolant may include coolant fluid, refrigerant gas, or air.

The connecting part pins may have a vertical axis structure including a linear structure, a non-linear structure, or a structure having penetration holes.

The connecting part pins may have a horizontal axis structure in the form of a tetragon, a circle, or an ellipse.

The connecting part pins may be formed of a material different from a material forming the upper cover or the lower cover.

The connecting part pins may be formed of a single copper material or an alloy containing 50 weight % or more of copper.

The upper cover, the lower cover, and the connecting part pins may be formed of a single aluminum material or an alloy containing 50 weight % or more of aluminum.

The connecting member may be formed of a solder or a material containing Cu or Ag.

The connecting member may be hardened by a sintering process.

The connecting member may be hardened by a soldering process

The connecting member may be non-conductive.

A surface of a substrate, where at least one semiconductor chip is installed on the upper surface or the lower surface of the semiconductor component, may be partially or entirely exposed and may directly contact the connecting member.

The cover body may be joined to the upper surface, the lower surface, or both upper and lower surfaces of the semiconductor components.

The cover body and the semiconductor component may be sequentially stacked over at least two layers.

The semiconductor component may include an inverter, a converter, or an on board charger (OBC).

The semiconductor component including the inverter, the converter, or the OBC may be applied to mobility using a battery.

The connecting part pins may be alternately inserted into the insertion grooves disposed at the upper cover or the lower cover.

According to another embodiment of the present invention, there is provided a semiconductor package having the system described above.

According to another embodiment of the present invention, there is provided a method of manufacturing a system for cooling semiconductor components including: preparing of a cover body comprising at least one upper cover and lower cover, which are separated from each other, face each other, and are combined to form a coolant flow path in an inner space thereof; forming of insertion grooves for connecting part pins to be inserted into the facing inner surfaces of the upper cover or the lower cover; inserting of the at least one connecting part pin into the insertion grooves toward a flowing direction of a coolant; combining of the upper cover to the lower cover; combining of an inlet, to which the coolant flows in, to one side of the cover body; and combining of an outlet, from which the coolant is discharged, to the other side of the cover body, wherein the upper cover or the lower cover of the cover body is combined to at least one of the upper surfaces or the lower surfaces of semiconductor components by using connecting members and thus, heat transmitted from the semiconductor components to the connecting part pins is cooled by the coolant.

The connecting part pins may be inserted into the insertion grooves by placing a gap of 5 mm or below interposed therebetween.

The connecting part pins may have a vertical axis structure including a linear structure, a non-linear structure, or a structure having penetration holes, or the connecting part pins may have a horizontal axis structure in the form of a tetragon, a circle, or an ellipse.

The cover body and the semiconductor component may be sequentially stacked over at least two layers.

BRIEF DESCRIPTION OF THE DRAWINGS

The above and other features and advantages of the present invention will become more apparent by describing in detail exemplary embodiments thereof with reference to the attached drawings in which:

FIGS. 6 through 7D are cross-sectional views of the semiconductor package of FIG. 5;

DETAILED DESCRIPTION OF THE INVENTION

Hereinafter, the present invention will be described in more detail with reference to the accompanying drawings.

A system for cooling semiconductor components according to an embodiment of the present invention includes a cover body 110, an inlet 120, an outlet 130, at least one connecting part pin 140, and insertion grooves 150, wherein the cover body 110 includes at least one upper cover 111 and lower cover 112, which are separated from each other, face each other, and are combined to form a coolant flow path P in an inner space thereof, the inlet 120 is combined to one side of the cover body 110 and is used for a coolant to flow in, the outlet 130 is combined to the other side of the cover body 110 and is used for a coolant to be discharged, the at least one connecting part pin 140 is inserted and arranged toward a flowing direction of the coolant in the inner space of the cover body 110, and the insertion grooves 150 are formed for the connecting part pins 140 to be inserted in the inner space of the cover body 110. The upper cover 111 or the lower cover 112 of the cover body 110 is combined to at least one of the upper surfaces or the lower surfaces of semiconductor components 200 by using connecting members 210 so that heat transmitted from the semiconductor components 200 to the connecting part pins 140 is efficiently radiated by enlarging an area contacting the coolant.

Hereinafter, the system for cooling semiconductor components mentioned above will be described more fully with reference to FIGS. 1A through 9J.

Figure 1A:
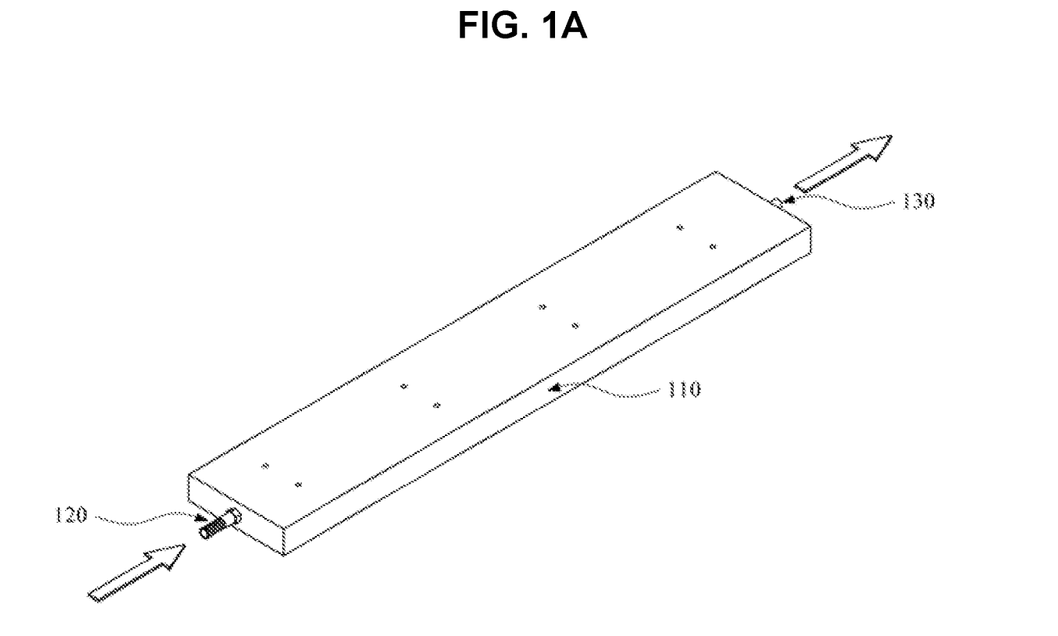
FIGS. 1A and 1B are perspective views of a system for cooling semiconductor components according to an embodiment of the present invention.
Figure 1B:
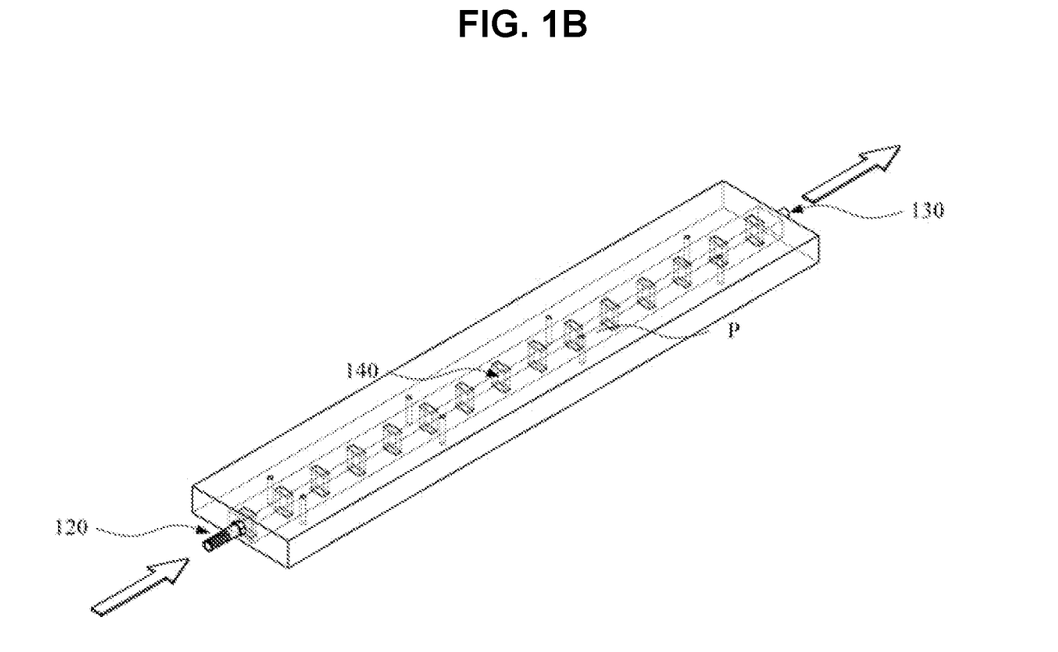
Figure 2:
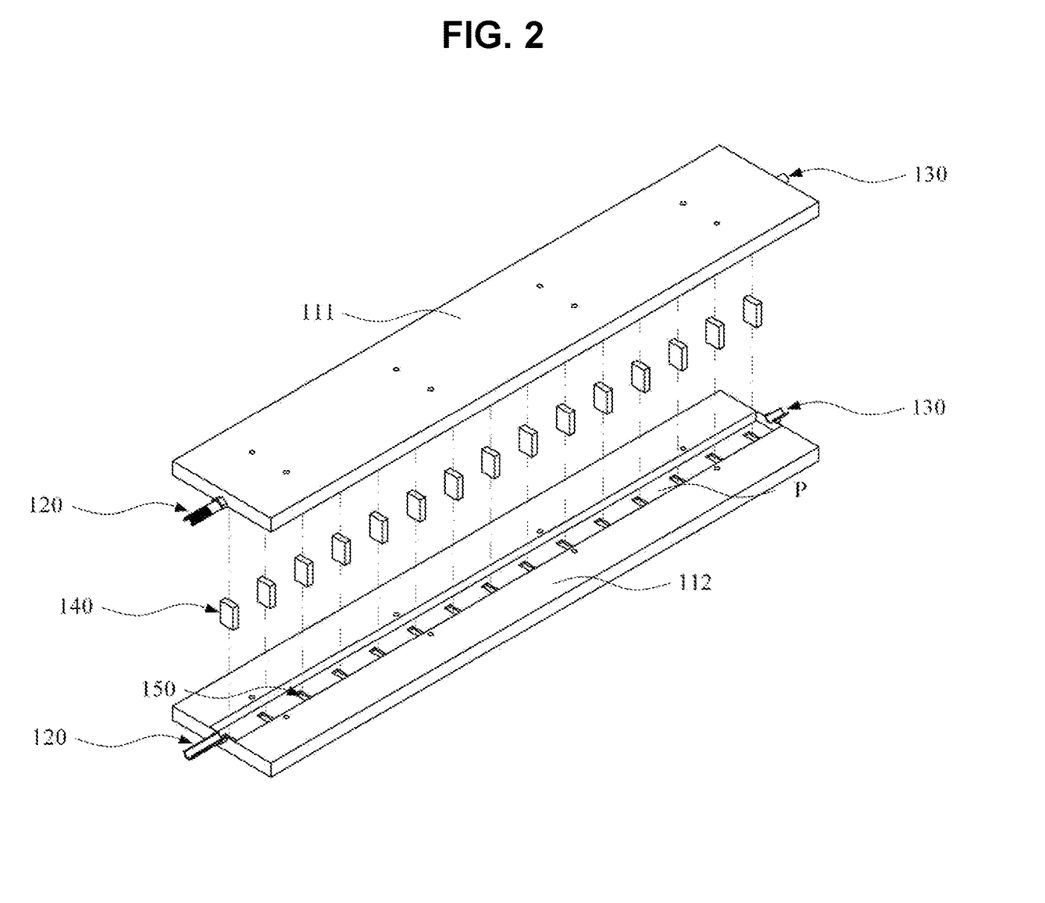
FIG. 2 is an exploded perspective view of the system for cooling semiconductor components of FIGS. 1A and 1B.

Firstly, as illustrated in FIGS. 1A through 2, the air-tightened or water-tightened inner space is formed in the cover body 110 after the at least one upper cover 111 and lower cover 112, which are separated from each other, face each other and are combined, wherein the inner space includes the coolant flow path P from the end of one side to the end of the other side.

Next, as illustrated in FIGS. 1A through 2, the inlet 120 is combined to the end of one side of the cover body 110 and makes the coolant flows through the coolant flow path P from the outside.

Next, as illustrated in FIGS. 1A through 2, the outlet 130 is combined to the end of the other side of the cover body 110 and makes the coolant passing through the coolant flow path P discharges therefrom to the outside.

Here, the inlet 120 and the outlet 130 are formed as a single structure and may be combined after being separately air-tightened or water-tightened while the upper cover 111 and the lower cover 112 are combined to each other. Also, as illustrated in FIG. 2, the inlet 120 and the outlet 130 are separately cut and formed on the upper cover 111 and the lower cover 112 and may be air-tightened or water-tightened when the upper cover 111 and the lower cover 112 are combined to each other. Accordingly, the single inlet 120 and the single outlet 130 may be respectively formed.

Here, the coolant may include coolant fluid, refrigerant gas, or air.

Next, the connecting part pins 140 are manufactured separately from the cover body 110. Thus, as illustrated in FIGS. 1A through 3, one or more connecting part pins 140 are arranged toward a flowing direction of the coolant in the inner space of the cover body 110 and inserted into the insertion grooves 150. Accordingly, an area where various forms of the connecting part pins 140 contact the coolant may be enlarged and heat radiation effect may be improved.

Next, the insertion grooves 150 are formed in the inner surfaces of the upper cover 111 and the lower cover 112 each corresponding to the forms of the connecting part pins 140 so that the connecting part pins 140 may be inserted in the inner space of the cover body 110 and arranged toward the direction of the coolant flow path P.

Figure 3:
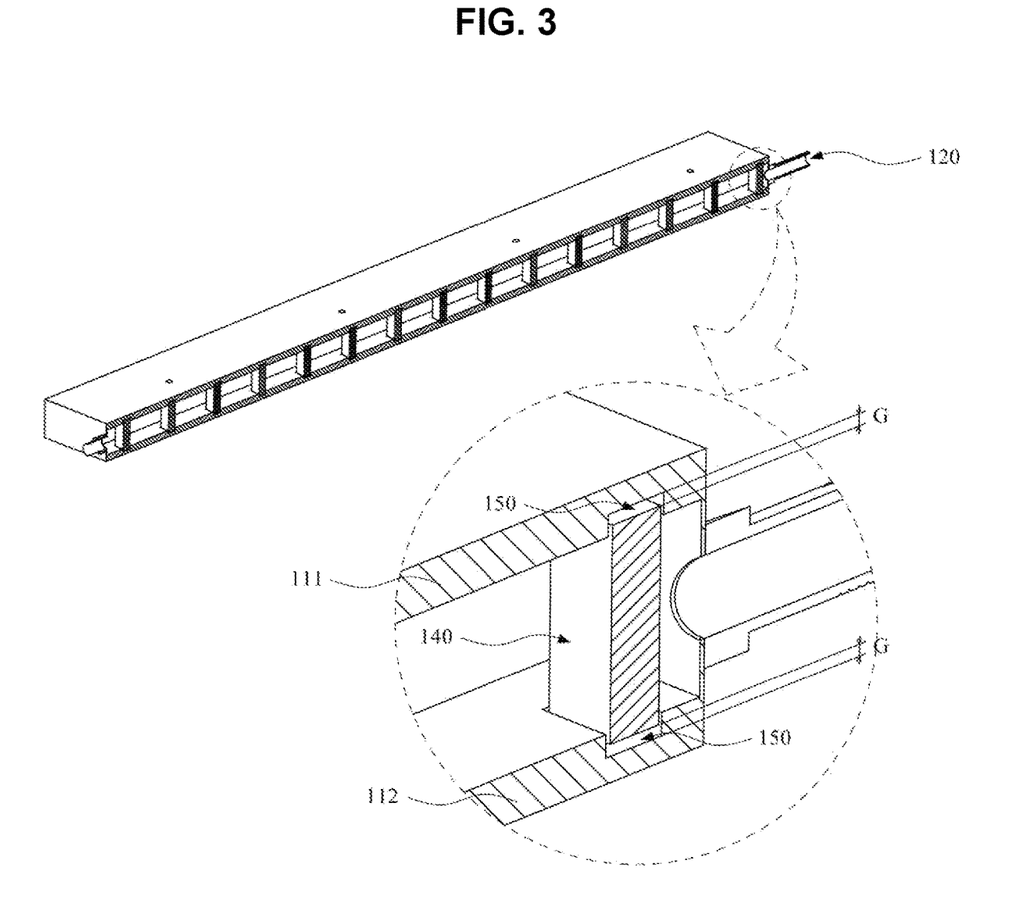
FIG. 3 is a cross-sectional view of the system for cooling semiconductor components of FIGS. 1A and 1B.
Figure 7A:
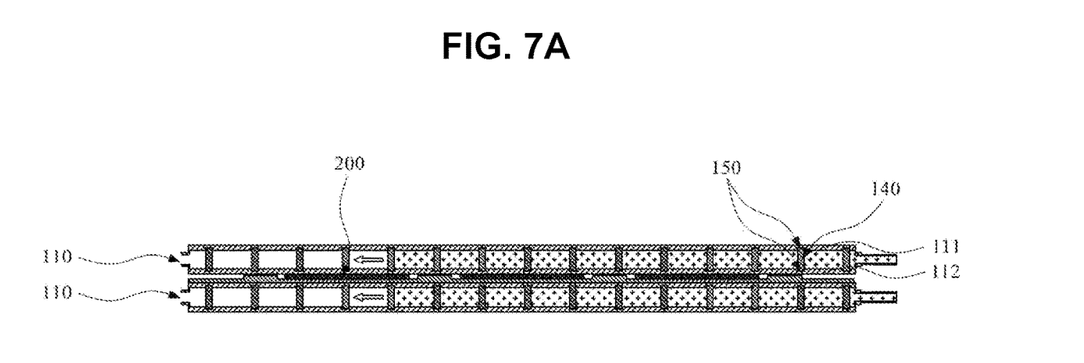
Figure 7B:
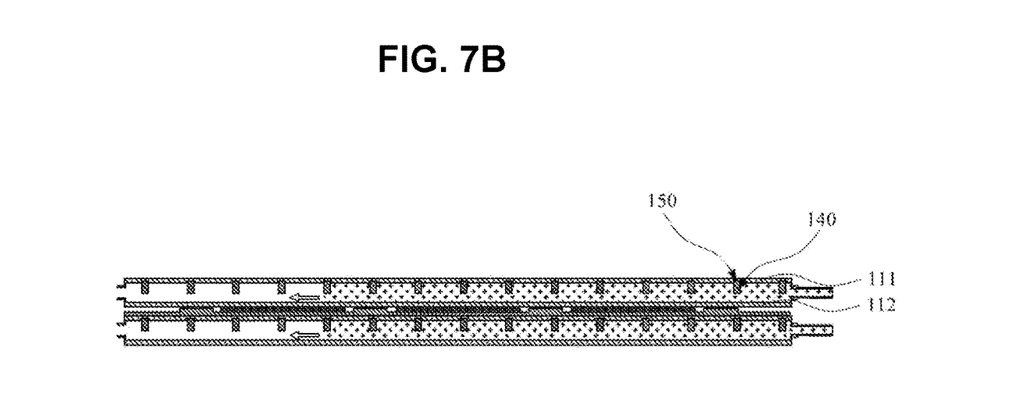

Here, as illustrated in FIGS. 3 and 7A, a pair of insertion grooves 150 facing each other may be formed for each connecting part pin 140 to be simultaneously inserted in the inner surfaces of the upper cover 111 and the lower cover 112, which face each other. Accordingly, the connecting part pins 140 may be interposed between the insertion grooves 150 disposed at the upper and lower sides. Also, as illustrated in FIG. 7B, the insertion grooves 150 may be formed for the connecting part pins 140 to be inserted in any one of the inner surfaces of the upper cover 111 or the lower cover 112, which face each other. Accordingly, the connecting part pins 140 may be selectively inserted into the insertion grooves 150 at the upper side or the lower side.

Figure 7C:
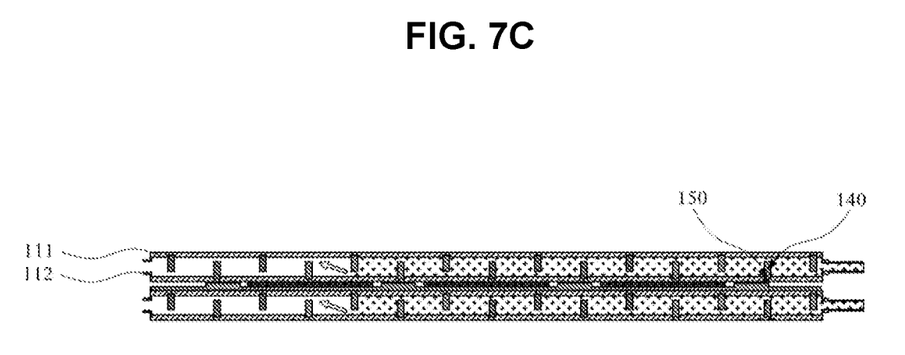

In addition, as illustrated in FIG. 7C, the connecting part pins 140 may be alternately inserted into the insertion grooves 150 disposed at the upper cover 111 or the lower cover 112.

As illustrated in the enlarged part of FIG. 3, the connecting part pin 140 may not be completely fit with the insertion groove 150 and instead, a gap G may be interposed between the connecting part pin 140 and the insertion groove 150. More preferably, the size of the gap G may be 5 mm or below and thus, heat may be efficiently released.

The upper sides or the lower sides of the connecting part pins 140 may partially contact the sides of the insertion grooves 150.

Figure 9A:
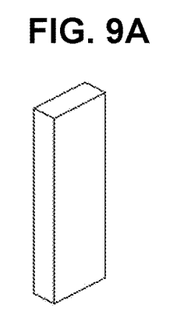
FIGS. 9A through 9J illustrate various forms of connecting part pins in the system for cooling semiconductor components of FIGS. 1A and 1B.
Figure 9B:
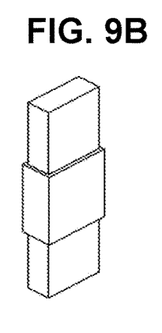
Figure 9C:
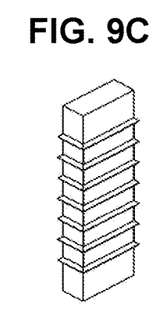
Figure 9D:
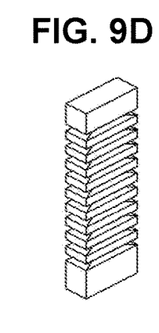
Figure 9E:
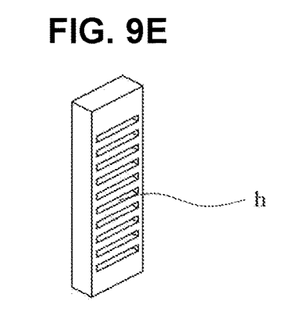
Figure 9F:
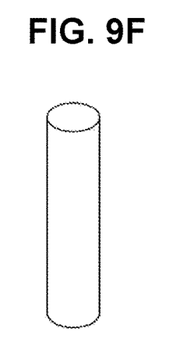
Figure 9G:
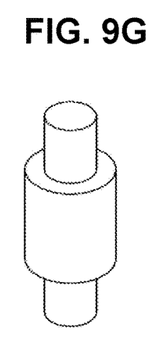
Figure 9H:
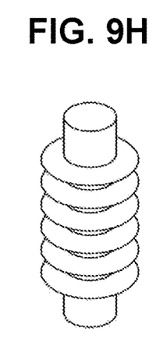
Figure 9I:
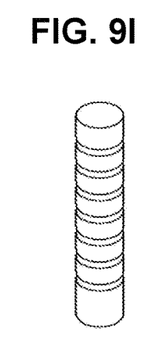
Figure 9J:
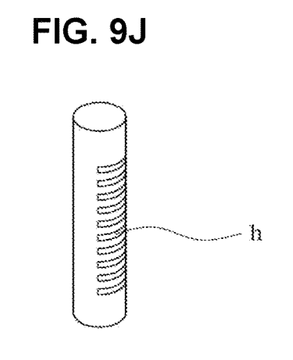

As illustrated in FIGS. 9A through 9J, a vertical axis structure of the connecting part pin 140 may include various forms as a linear structure (FIGS. 9A and 9F), a non-linear structure (FIGS. 9B, 9C, 9D, 9G, 9H, and 9I), or a structure having penetration holes h through which a coolant passes (FIGS. 9E and 9J).

Also, a horizontal axis structure of the connecting part pin 140 may be in the form of a tetragon (FIGS. 9A, 9B, 9C, 9D, and 9E), a circle (FIGS. 9F, 9G, 9H, 9I, and 9J), or although not illustrated, an ellipse.

Here, the connecting part pins 140 may be formed of a material different from a material forming the upper cover 111 or the lower cover 112 and may be a single copper or an alloy containing 50 weight % or more of copper.

Also, the upper cover 111, the lower cover 112, and the connecting part pins 140 may be formed of a single aluminum material or an alloy containing 50 weight % or more of aluminum.

Figure 5:
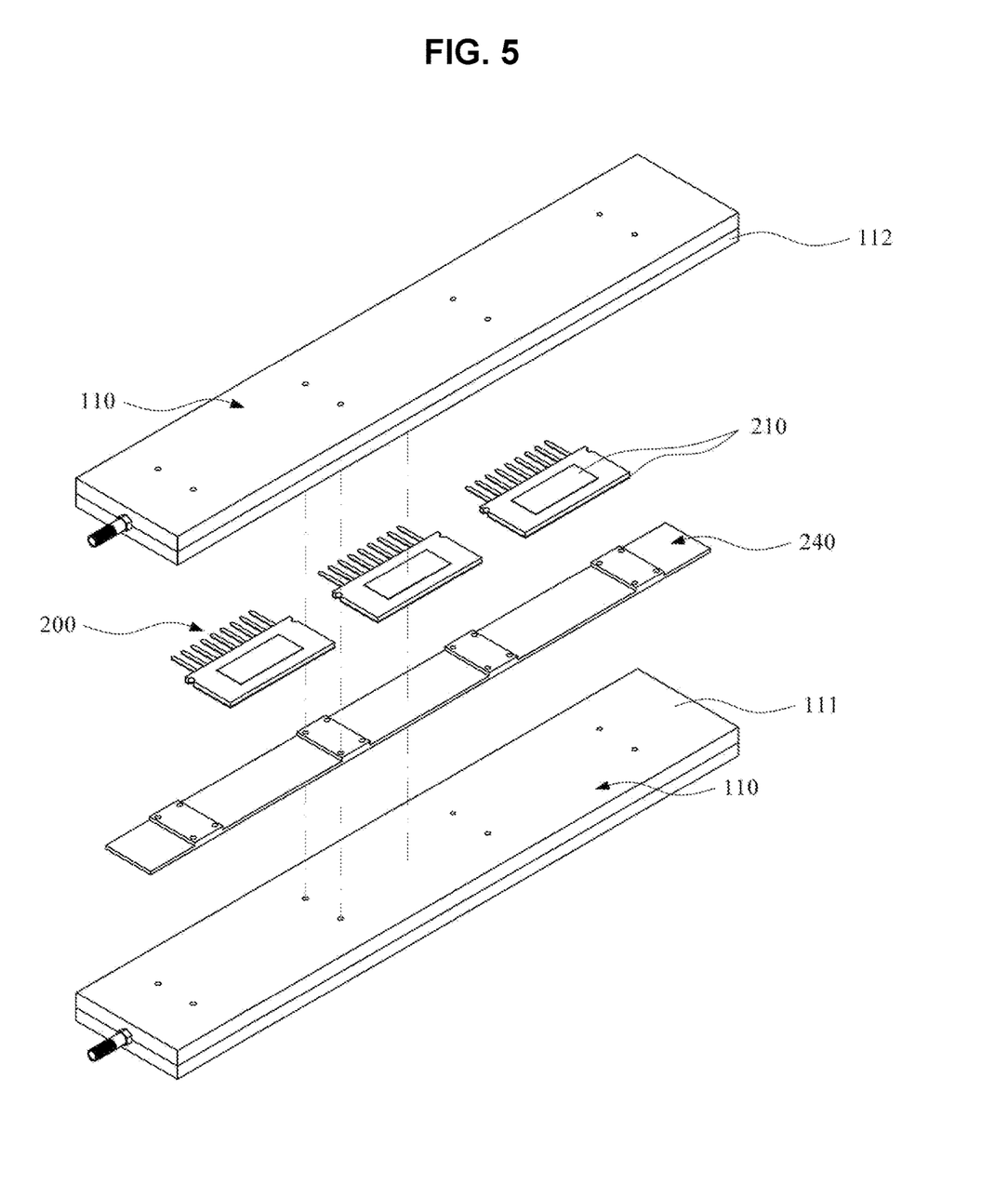
FIG. 5 is an exploded perspective view of the semiconductor package of FIGS. 4A and 4B.
Figure 6:
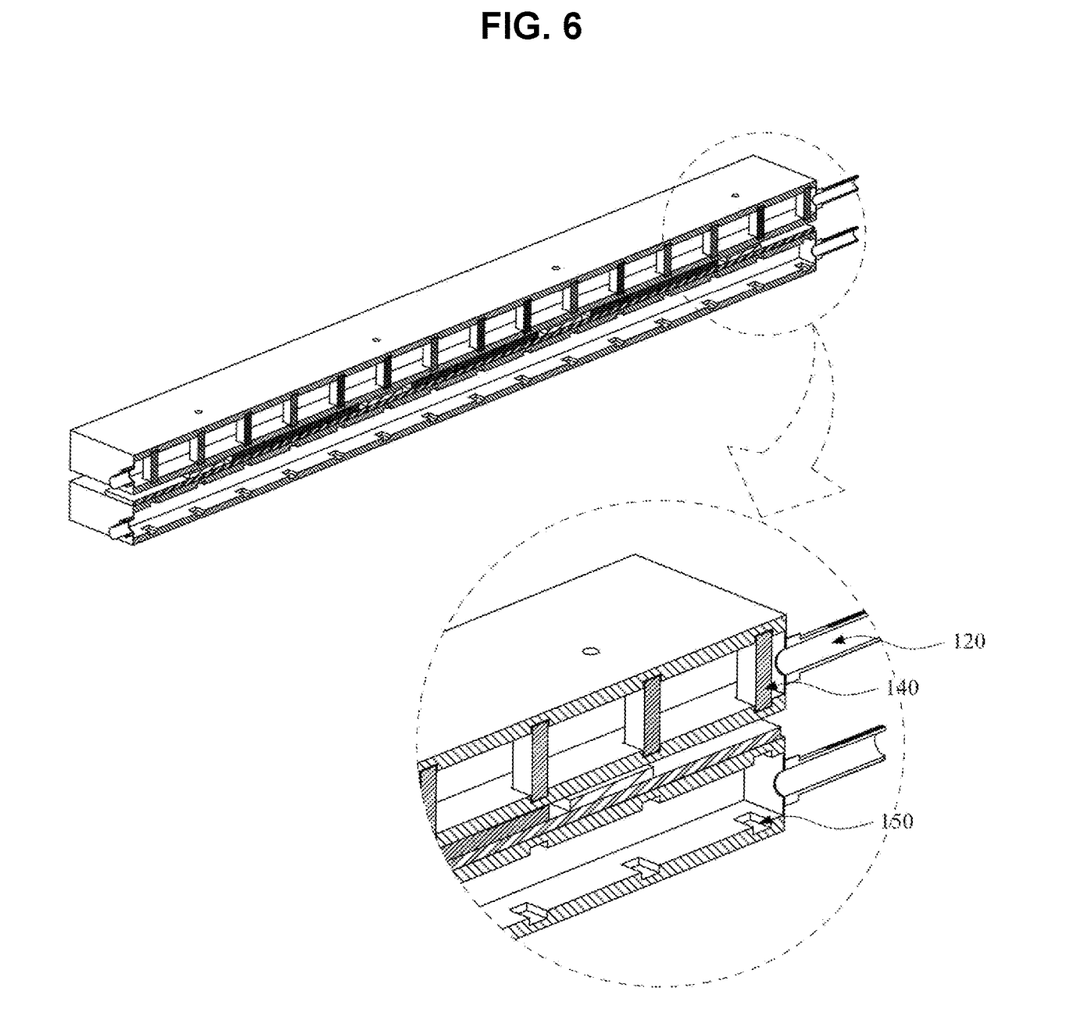
Figure 8A:
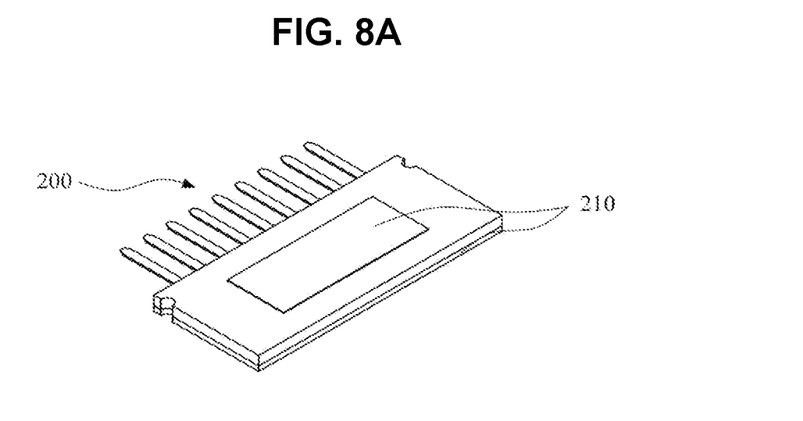
FIGS. 8A and 8B illustrate a semiconductor component to which the system for cooling semiconductor components of FIGS. 1A and 1B is applied.

Referring to FIGS. 5 and 8A, the upper cover 111 or the lower cover 112 of the cover body 110 is joined to at least one of the upper surfaces or the lower surfaces of the semiconductor components 200 by using the connecting members 210. Accordingly, heat transmitted from the semiconductor components 200 to the connecting part pins 140 having various forms to enlarge a contact surface may be efficiently cooled by a coolant. Therefore, thermal stability of the semiconductor components 200 may be secured.

The temperature of the coolant passing through the coolant flow path P may be set to be the same as or lower than the surface temperature of the upper surfaces or the lower surfaces of the semiconductor components 200 joined to the upper cover 111 or the lower cover 112 of the cover body 110, when the semiconductor components 200 are electrically operated.

Also, as illustrated in FIG. 5, a plurality of semiconductor components 200 may be arranged on an arrangement frame 240.

The semiconductor component 200 may include an inverter, a converter, or an on board charger (OBC) and may be applied to mobility using a battery.

Here, the connecting member 210 may be a non-conductive adhesive or an adhesive film both having an excellent thermal conductivity.

Also, the connecting member 210 may be formed of a solder or a material containing Cu or Ag and may be hardened by a sintering process or a soldering process.

Figure 8B:
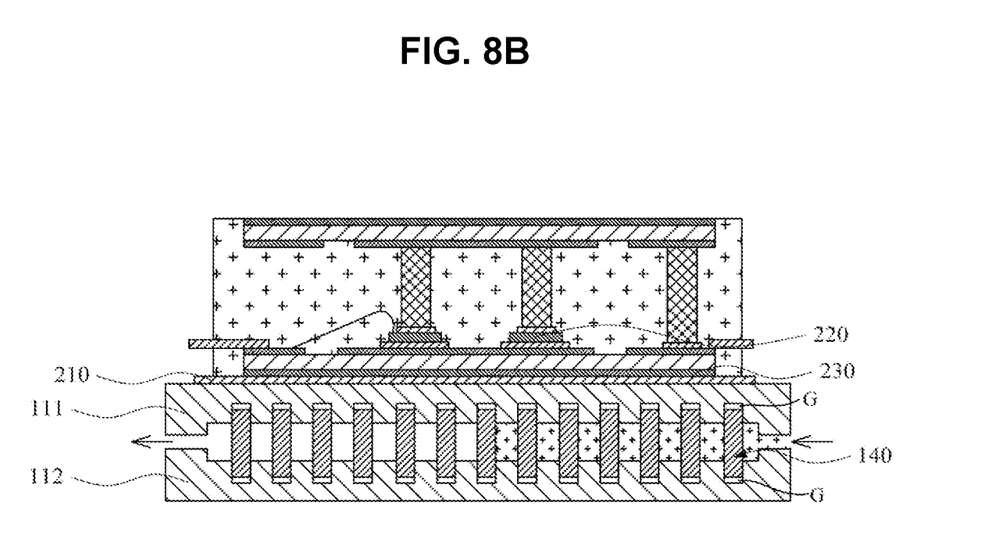

FIG. 8A illustrates the semiconductor component 200 and FIG. 8B is a cross-sectional view where the system for cooling semiconductor components is applied to the semiconductor component 200. A surface of a substrate 230, where at least one semiconductor chip 220 is installed on the upper surface or the lower surface of the semiconductor component 200, is partially exposed and directly contacts the connecting member 210. Accordingly, heat may be efficiently transmitted from the semiconductor chips 220 to the coolant through the upper cover 111 and the connecting part pins 140.

Figure 4A:
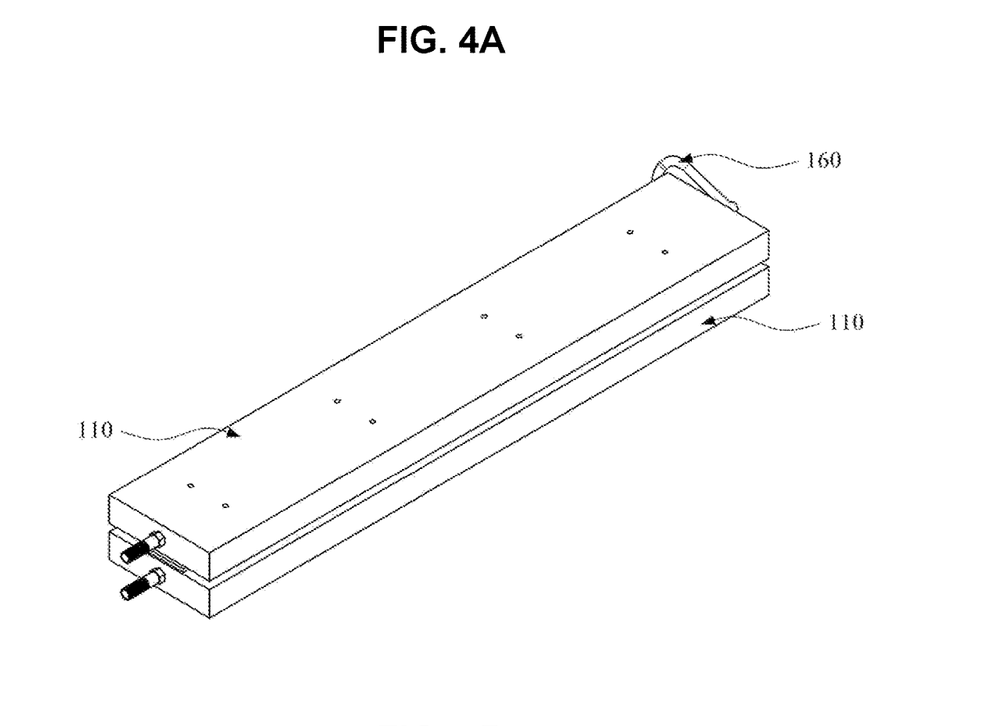
FIGS. 4A and 4B are perspective views of a semiconductor package having a system for cooling semiconductor components according to another embodiment of the present invention.
Figure 4B:
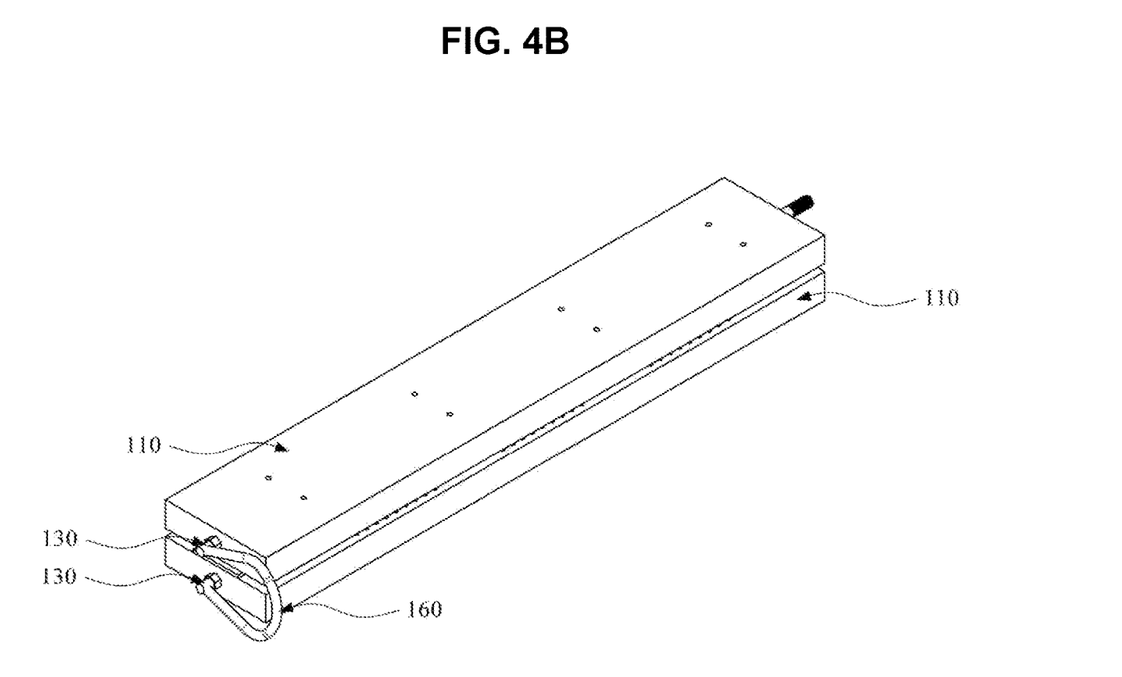

The cover body 110 may be joined to any one of the upper surface and the lower surface of the semiconductor component 200 or as illustrated in FIGS. 4A and 4B, the cover body 110 may be each joined to the upper surface and the lower surface of the semiconductor component 200. In this regard, each outlet 130 of the cover body 110 disposed at the upper side and the lower side may be connected using a circulating pipe 160 and thus, the coolant may be circulated.

Figure 7D:
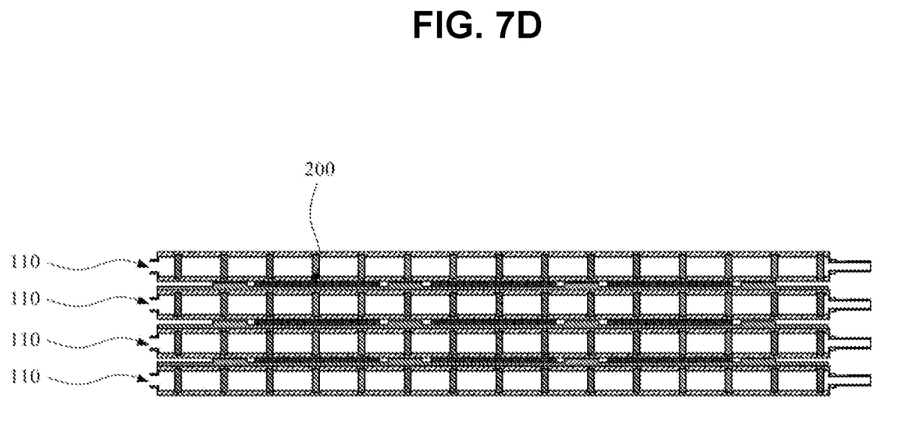

In addition, as illustrated in FIG. 7D, at least two layers of the cover body 110 and the semiconductor component 200 may be sequentially stacked.

According to another embodiment of the present invention, a semiconductor package having the system for cooling semiconductor components mentioned above is provided as illustrated in FIGS. 4A and 4B.

Figure 10:
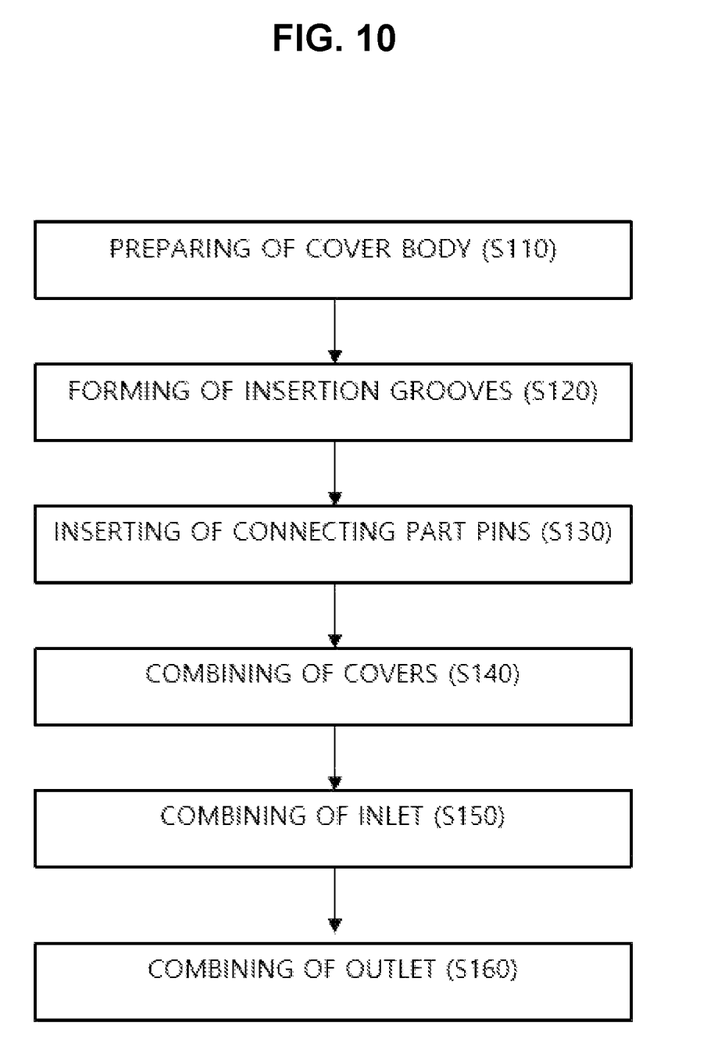
FIG. 10 is a flowchart schematically illustrating a method of manufacturing a system for cooling semiconductor components according to another embodiment of the present invention.

FIG. 10 is a flowchart schematically illustrating a method of manufacturing a system for cooling semiconductor components according to another embodiment of the present invention.

Referring to FIG. 10, the method of manufacturing a system for cooling semiconductor components according to another embodiment of the present invention includes preparing of the cover body 110 including at least one upper cover 111 and lower cover 112, which are separated from each other, face each other, and are combined to form the coolant flow path P in an inner space thereof, in operation S110, forming of the insertion grooves 150 for the separately formed connecting part pins 140 to be inserted into the facing inner surfaces of the upper cover 111 or the lower cover 112, in operation S120, inserting of the at least one connecting part pin 140 into the insertion grooves 150 toward a flowing direction of the coolant, in operation S130, combining of the upper cover 111 to the lower cover 112, in operation S140, combining of the inlet 120, to which the coolant flows in, to one side of the cover body 110, in operation S150, and combining of the outlet 130 from which the coolant is discharged to the other side of the cover body 110, in operation S160.

In this regard, the upper cover 111 or the lower cover 112 of the cover body 110 is joined to at least one of the upper surfaces or the lower surfaces of the semiconductor components 200 by using the connecting members 210 so that heat transmitted from the semiconductor components 200 to the connecting part pins 140 is efficiently radiated by enlarging an area contacting the coolant.

Here, as mentioned above, the connecting part pin 140 may not be completely fit with the insertion groove 150 and instead, the gap G may be interposed between the connecting part pin 140 and the insertion groove 150. More preferably, the size of the gap G may be 5 mm or below and thus, heat may be efficiently released.

Also, a vertical axis structure of the connecting part pin 140 may include various forms such as a linear structure (FIGS. 9A and 9F), a non-linear structure (FIGS. 9B, 9C, 9D, 9G, 9H, and 9I), or a structure having penetration holes h through which a coolant passes (FIGS. 9E and 9J). A horizontal axis structure of the connecting part pin 140 may be in the form of a tetragon (FIGS. 9A, 9B, 9C, 9D, and 9E), a circle (FIGS. 9F, 9G, 9H, 9I, and 9J), or although not illustrated, an ellipse.

In addition, at least two layers of the cover body 110 and the semiconductor component 200 may be sequentially stacked.

Therefore, in the system for cooling semiconductor components, the method of manufacturing the same, and the semiconductor package having the system described above, the connecting part pins may be separately manufactured to be arranged in the cover body so that the connecting part pins having various forms such as a linear or non-linear structure may be formed to enlarge an area contacting a coolant and thereby, heat radiation effect and heat conductivity effect may be improved.

According to the present invention, the connecting part pins are separately manufactured to be arranged in the cover body so that the connecting part pins having various forms such as a linear or non-linear structure may be formed to enlarge an area contacting a coolant and thereby, heat radiation effect and heat conductivity effect may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A system for cooling semiconductor components comprising:
    a cover body comprising an upper cover and a lower cover, which are separated from each other, face each other, and are combined to form a coolant flow path in an inner space thereof;
    an inlet combined to one side of the cover body and used for a coolant to flow in;
    an outlet combined to the other side of the cover body and used for the coolant to be discharged;
    a plurality of upper insertion grooves formed on a bottom surface of the upper cover;
    a plurality of lower insertion grooves formed on a top surface of the lower cover; and
    a plurality of connecting part pins inserted between the upper insertion grooves and the lower insertion grooves, respectively, wherein an upper gap is formed between an upper end of each connecting part pin and a corresponding upper insertion groove, and a lower gap is formed between a lower end of each connecting part pin and a corresponding lower insertion groove,
    wherein the upper cover or the lower cover of the cover body is combined to at least one of the upper surfaces or the lower surfaces of semiconductor components by using connecting members and thus, heat transmitted from the semiconductor components to the connecting part pins is cooled by the coolant.

2. The system of claim 1, wherein the temperature of the coolant is the same as or lower than the surface temperature of the upper surfaces or the lower surfaces of the semiconductor components joined to the upper cover or the lower cover of the cover body.

3. The system of claim 1, wherein a height of the upper and lower gaps is 5 mm or below.

4. The system of claim 1, wherein upper sides and lower sides of the connecting part pins partially contact sides of the upper and lower insertion grooves.

5. The system of claim 1, wherein the connecting part pins have a vertical axis structure comprising a linear structure, a non-linear structure, or a structure having penetration holes.

6. The system of claim 1, wherein the connecting part pins have a horizontal axis structure in the form of a tetragon, a circle, or an ellipse.

7. The system of claim 1, wherein the connecting part pins are formed of a material different from a material forming the upper cover or the lower cover.

8. The system of claim 1, wherein the connecting part pins are formed of a single copper material or an alloy containing 50 weight % or more of copper.

9. The system of claim 1, wherein the connecting member is formed of a solder or a material containing Cu or Ag.

10. The system of claim 1, wherein the connecting member is non-conductive.

11. The system of claim 1, wherein a surface of a substrate, where at least one semiconductor chip is installed on the upper surface or the lower surface of the semiconductor component, is partially or entirely exposed and directly contacts the connecting member.

12. The system of claim 1, wherein the cover body is joined to the upper surface, the lower surface, or both upper and lower surfaces of the semiconductor components.

13. The system of claim 1, wherein the cover body and the semiconductor component are sequentially stacked over at least two layers.

14. The system of claim 1, wherein the semiconductor component comprises an inverter, a converter, or an on board charger (OBC).

15. The system of claim 14, wherein the semiconductor component comprising the inverter, the converter, or the OBC is applied to mobility using a battery.

16. A semiconductor package having the system of claim 1.

17. A method of manufacturing a system for cooling semiconductor components, the method comprising:
    preparing of a cover body comprising an upper cover and a lower cover, which are separated from each other, face each other, and are combined to form a coolant flow path in an inner space thereof;
    forming of a plurality of upper insertion grooves on a bottom surface of the upper cover;
    forming of a plurality of lower insertion grooves on a top surface of the lower cover;
    inserting of a plurality of connecting part pins between the upper insertion grooves and the lower insertion grooves, respectively, wherein an upper gap is formed between an upper end of each connecting part pin and a corresponding upper insertion groove, and a lower gap is formed between a lower end of each connecting part pin and a corresponding lower insertion groove;

combining of the upper cover to the lower cover;

combining of an inlet, to which the coolant flows in, to one side of the cover body; and combining of an outlet, from which the coolant is discharged, to the other side of the cover body, wherein the upper cover or the lower cover of the cover body is combined to at least one of the upper surfaces or the lower surfaces of semiconductor components by using connecting members and thus, heat transmitted from the semiconductor components to the connecting part pins is cooled by the coolant.

\* \* \* \* \*